Oct. 4, 1955 J. T. McNANEY 2,719,923

AUTOMATIC TUNING SYSTEM

Filed Oct. 31, 1950 2 Sheets-Sheet 1

JOSEPH T. McNANEY
*INVENTOR.*

*BY*
Killman and Kerst

JOSEPH T. McNANEY
INVENTOR.

BY Killman and Kerst

United States Patent Office 2,719,923

Patented Oct. 4, 1955

2,719,923

AUTOMATIC TUNING SYSTEM

Joseph T. McNaney, San Diego, Calif., assignor to Bendix Aviation Corporation, Towson, Md., a corporation of Delaware Application October 31, 1950, Serial No. 193,134

6 Claims. (Cl. 250—40)

This invention relates to the automatic tuning of multiple channel high frequency radio receivers. More specifically the invention is for the purpose of adjusting R. F. amplifier circuits to a desired signal frequency after the oscillator frequency has been changed by manually switching the proper crystal into the oscillator circuit. The tuning system of the instant invention accomplishes such tuning with a considerably greater degree of accuracy than has been heretofore achieved.

It is an object of this invention to provide an automatic tuning system which is capable of positioning ganged condensers to within .1 degree of the proper setting.

It is a further object of the invention to provide an automatic tuning system which accomplishes the major portion of the tuning movement at a high rate of speed, proceeding more slowly with the final adjustment.

Referring now to the drawing.

Figure 2:
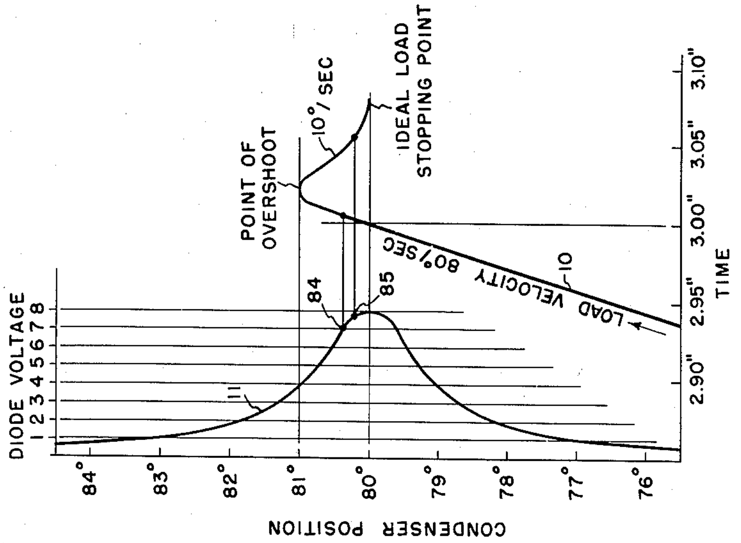
Fig. 2 is a composite graph illustrating the resonance curve of a circuit being tuned and the corresponding travel of a condenser being tuned as the position of resonance is approached; and, Fig. 3 is a schematic circuit diagram of a system embodying the invention.

The objects and advantages of the invention are realized by a system in which the action of switching a new crystal into the oscillator circuit initiates the tuning action, causing the ganged condensers to be driven rapidly to their closed positions, then to be driven rapidly until the resonant point of the oscillator tank is reached and slightly passed. The tuning movement is then reversed again and the condensers driven slowly to the desired setting, whereupon the tuning movement ceases.

Figure 1:
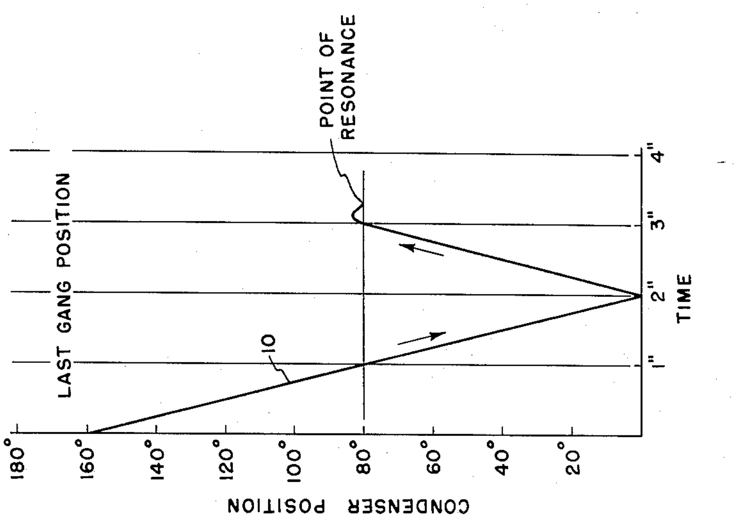
Fig. 1 is a graph illustrating the rate and directions of condenser movement in the operation of a tuning system in accordance with the invention.

Referring now more particularly to the drawing:

There is shown in Fig. 1 a graph illustrating the movement of the ganged condensers which takes place during the tuning operation in the system to be illustrated. The ordinates represent condenser position in terms of degrees of rotation and the abscissas represent time in seconds. The curve 10 represents the movement of the condenser. Let it be assumed that the last position of the gang was at 160° as indicated, and that it is desired to select a new channel in which the point of resonance of the oscillator tank circuit occurs at a condenser position of 80°. In the operation of the illustrated embodiment of the invention, upon the switching of the new crystal into the oscillator circuit, the ganged condensers will be caused to rotate at 80° per second to the closed position of the condensers, at which point the rotation of the condensers will be reversed and will proceed at the same rate until the point of resonance of the oscillator tank circuit is reached. Rotation will proceed past this point a short distance and then will be reversed again and the condensers tuned slowly back to the exact position corresponding to the tank circuit resonance point.

This is more clearly illustrated in Fig. 2 in which a portion of the curve 10 is drawn to a larger scale, and is illustrated in conjunction with the resonance curve 11 of the oscillator tank circuit. It will be noted that the point of resonance of the tank circuit occurs at a condenser setting of 80°. Only the latter portion of the curve 10 is shown. It will be seen that this curve illustrates condenser movement at the rate of 80° per second past the resonance point, continuing until a condenser position of 81° is reached. At this point reversal of condenser movement occurs and this movement continues at the rate of 10° per second back to the 80° point at which it ceases.

Figure 3:
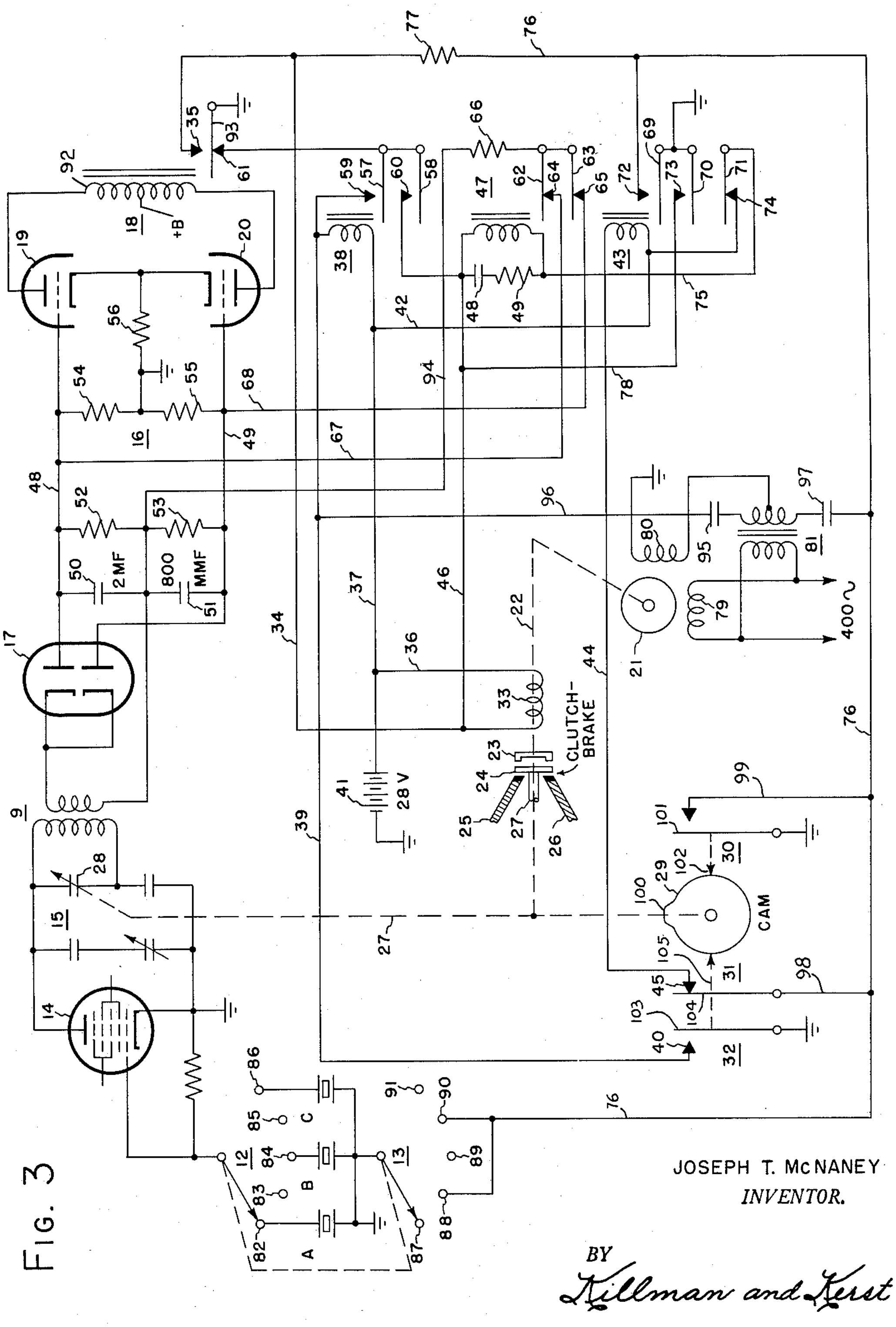

Fig. 3 is a schematic diagram of an automatic tuning circuit which will produce the type of motion illustrated in Figs. 1 and 2. A plurality of crystals A, B and C are shown which are selectively switched into the oscillator circuit in changing from one channel to another. This is accomplished by a switch 12 which is ganged with a second switch 13. A portion of the oscillator circuit is shown, including a vacuum tube 14 having a tank circuit 15 which is coupled to a voltage memory network 16 by way of a transformer 9 and a dual-diode 17. An output voltage from the voltage memory network 16 is used to control the operation of a balanced relay 18 in the plate circuit of a dual-triode comprising electrode assemblies 19 and 20. The relay 18 comprises a coil 92 having its terminals connected to the anodes of electrode assemblies 19 and 20 and center tapped to a source of positive voltage indicated as +B. Coacting with the coil is a grounded armature 93 movable between an upper contact 35 and a lower contact 61.

A split-phased, low-enertia motor 21 is used to rotate the oscillator tuning condenser 28. It also rotates the one or more R. F. tuning condensers, which are not shown. A shaft 22, driven by the motor, includes a clutch-brake assembly comprising the elements 23 and 24. The element 23 is a clutch plate and one surface of the element 24 likewise serves as a clutch plate. The opposite surface of the element 24 acts as a brake when the clutch is not engaged, being forced into frictional contact with frame members 25 and 26. The element 24 has secured to it a shaft 27 by means of which the condensers are positioned. Mounted on the shaft 27 is a cam 29 which controls the positioning of three switches 30, 31 and 32. The periphery of the cam 29 is circular except for a raised portion 100. The switches 30, 31 and 32 are of the single pole, single throw type. The movable contact 101 of switch 30 is provided with an operator 102 biased to contact with the periphery of the cam. The movable contacts 103 and 104 of switches 31 and 32 are ganged by an operator 105 which is biased to contact with the periphery of the cam. When the operators 102 and 105 are riding on the circular portion of the cam's periphery the switch 31 is closed and switches 30 and 32 are open.

The clutch-brake assembly is actuated by a solenoid coil 33, one terminal of which is connected by a lead 34 to the upper contact 35 of balanced relay 18. The other terminal of solenoid 33 is connected by leads 36 and 37 to one terminal of a relay 38. The other terminal of the relay 38 is connected by lead 39 to contact 40 of switch 32. The armature of this switch is grounded. The first mentioned terminal of relay 38 is likewise connected by lead 37 to a 28-volt battery 41. This terminal is also connected by a lead 42 to the lower terminal of a relay 43. The upper terminal of this relay is connected by a lead 44 to the contact 45 of switch 31. One terminal of solenoid coil 33 is also connected by lead 46 to the upper terminal of a relay 47. The terminals of this relay are shunted by a serially connected condenser 48 and resistor 49.

Referring now to the voltage memory circuit:

The anodes of the dual-diode 17 are respectively connected to the control grids of electrode assemblies 19 and 20 by means of conductors 48 and 49. Connected across these conductors are a pair of condensers 50 and 51 in series. The junction point of these condensers is connected to the cathodes of the dual-diode 17. Also connected between the conductors 48 and 49 are a pair of resistors 52 and 53 in series. The junction point of these resistors is connected to the junction point of condensers 50 and 51. Also connected between the conductors 48 and 49 are a pair of resistors 54 and 55 in series. The junction point of these resistors is grounded and is connected through a resistor 56 to the junction point of the cathodes of electrode assemblies 19 and 20.

The relay 38 actuates a pair of armatures 57 and 58 which coact respectively with contacts 59 and 60. The contact 59 is connected to the upper terminal of the relay. Armature 57 is connected to the lower contact 61 of balanced relay 18. The contact 60 is connected to the upper terminal of the relay 47.

The relay 47 actuates a pair of armatures 62 and 63 which coact with contacts 64 and 65 respectively. These armatures are connected together and connected by way of conductor 94 and resistance 66 to the junction point of resistors 52 and 53 in the voltage memory circuit. The contact 64 is connected by a lead 67 to conductor 48. Contact 65 is connected by a lead 68 to conductor 49.

The relay 43 actuates three armatures 69, 70 and 71. Armature 69 coacts with the contact 72. Armature 70 coacts with a contact 73 and armature 71 coacts with the contact 74. Armatures 69 and 70 are grounded. Armature 71 is connected to the lower terminal of relay 47 by way of conductor 75. Contact 72 is connected by way of a lead 76 and a resistor 77 to the upper contact 35 of the balanced relay 18. Contact 73 is connected by way of a conductor 78 to the upper terminal of relay 47. Contact 74 is connected to the lower terminal of relay 43.

The direction of rotation of the motor 21 is governed by a pair of windings 79 and 80. The motor is supplied with operating voltage by way of a transformer 81. The terminals of coil 79 are connected across the terminals of the primary of this transformer. One of the terminals of the secondary is connected by way of the condenser 95 and conductor 96 to the lead 39. The remaining terminal is connected by way of a condenser 97 to the lead 76. The mid-point of the secondary is connected to one terminal of winding 80, the remaining terminal of the winding being grounded.

Switches 12 and 13 are ganged. Switch 12 is provided with five contacts 82 to 86. Switch 13 is likewise provided with five contacts 87 to 91. Contacts 83, 84 and 86 connect with crystals A, B and C, respectively. The other terminals of these crystals are grounded and are also connected to the switch arm of switch 13. Contacts 83 and 85 are dummies.

In switch 13, contacts 87, 89 and 91 are dummies, while 88 and 90 are connected to lead 76. This lead is also connected by lead 98 to the switch arm of switch 31 and by lead 99 to the contact of switch 30.

Proceeding now with the operation of the system we find, that as illustrated in Fig. 3, crystal A is in the oscillator circuit and switch 13 is open. The relay 18 is deenergized because equal and out of phase currents will be flowing in opposite halves of its winding. Relays 38, 47 and 43 are deenergized because the ground connections to their respective windings are held open by various switches. For example, the ground connection of relay 38 is held open by switch 32, while the ground connections of relays 47 and 43 are opened at the contacts 35 and 73. The clutch brake winding 33 is likewise disconnected from ground, allowing the element 24 to be drawn to the left and the brake to be in the "on" position.

If the operator desires to retune the receiver to another channel, it is only necessary to switch to another crystal. In switching from crystal A to crystal B the switch arm of the switch 13 will momentarily close the contact 88. This will connect the contact 88 to ground and will energize relay 43, a circuit being completed from ground through contact 88, a portion of lead 76, lead 98, switch 31, lead 44, relay 43, lead 42, lead 37, and the battery 41. When relay 43 is energized its contact 72 and armature 69 engage, holding it in the energized position. The energization of this relay performs three functions. It causes the right-hand terminal of the secondary of transformer 81 to be grounded through the phase shift condenser 97, lead 76 and switch 13. It causes the winding of relay 47 to be disconnected from the battery 41 by disengagement of armature 71 from contact 74. It also connects the clutch-brake winding 33 and the winding of relay 47 to ground through the engagement of armature 70 with contact 73.

The operation of relay 43, by providing a ground for solenoid coil 33, releases the brake while allowing the clutch to engage. The normally open circuited motor winding 80 is energized to drive the condenser gang to a closed position and the relay 47 is kept in a deenergized condition. As long as the relay 47 is maintained in this state, a low resistance or short circuiting shunt is maintained across resistors 52 and 53 of the voltage memory circuit, through leads 67 and 68 and the armatures and contacts of relay 47.

As the condenser gang reaches a closed position, the raised portion 100 of the cam 29 reaches the actuator 105 of switches 31 and 32 causing the switch 31 to open and switch 32 to close. The opening of switch 31 disconnects relay 43 from ground, thus deenergizing it. The closing of switch 32 connects the winding of relay 38 to ground through the conductor 39.

The deenergization of relay 43 disconnects the lower terminal of the secondary of transformer 81 from ground through the armature 69 and contact 72. By this time the switch 13 has proceeded to contact 89, so there is no connection to ground available. The motor winding 80 is therefore deenergized. The deenergization of relay 43 also connects the winding of relay 47 to the battery 41 through armature 71, contact 74 and leads 42 and 37. At the same time the clutch-brake solenoid 33 is disconnected from ground at armature 70.

After relay 38 is energized it is held in this state through a ground connection made by its switch contact 59 and armature 57, the connection being completed through contact 61 of the relay 18. This circuit also connects the upper terminal of the secondary of transformer 81 to ground through a phase shifting condenser 95, the leads 96 and 39, and switch 32. This energizes the motor winding 80 in the opposite sense to its previous energization, causing the motor to reverse and drive the condenser gang away from its closed condition.

The closing of relay 38 also allows its switch contact 60 to engage armature 58 to keep the brake in an "off" position and at the same time energize relay 47 by grounding its winding through contact 61 of relay 18. Both contacts of relay 47 are now disengaged from their associated armatures, releasing the short circuit across resistors 52 and 53.

The system in its present condition will allow the condenser gang to be driven toward its correct setting at the same speed at which it was formerly driven to a closed position. The correct setting of the condenser gang will be that which allows the tank circuit of the oscillator to resonate at the frequency of the crystal B. As the tank circuit of the oscillator is tuned to the point of resonance, the voltage across the secondary of transformer 9 will be increased from zero to the maximum output voltage of the oscillator.

The oscillator output voltage is rectified in dual half-wave rectifier 17 establishing equal D. C. voltages across resistance 52, condenser 50 and resistance 53, condenser 51 up to the point of oscillator tank circuit resonance. The voltage between the grids of electrode assemblies 19 and 20 will be zero up to this point, maintaining a balanced current flow through the halves of the winding of relay 18.

After passing through the point of resonance, the voltage across resistor 53 will diminish substantially in accordance with the decreasing voltage of the secondary across transformer 9. But the voltage across resistor 52 will decrease at a rate equal to the discharge time of condenser 50 through the resistor 52. It should be noted that the capacity of condenser 50 is much greater than that of condenser 51, the two being indicated in Fig. 3 as being of 2 micro-farads and 800 micro micro-farads, respectively. A time constant of 20 seconds for the R. C. circuit 52, 50 has proven satisfactory. The peak voltage at resonance is thereby remembered by the circuit 16 for an appreciable time and the difference between it and the voltage across resistor 53 is impressed across resistors 54 and 55. The resulting grid voltage difference unbalances the plate current flow through the balanced winding of relay 18 causing its armature 93 to disengage from contact 61 to engage contact 35.

In Fig. 2 there is provided a voltage scale, at the upper boundary of the graph, indicating the difference in diode voltages existing at various points of condenser position after the point of resonance has been passed in the operation of the system. At the point 84 on the resonance curve a voltage difference of 1 volt will exist between the diode outputs, the output of one diode having decreased to 7 volts, while that of the other remains substantially at 8 volts. At this point the relay 18 is energized with the effects which have been described, bringing the condenser travel to a stop and reversing it at a condenser position of 81°.

The disengagement of the armature 93 from contact 61 deenergizes relay 38, disengaging its contact 59 from armature 57, thus removing the ground from the upper terminal of the secondary of transformer 81 and deenergizing the winding 80 of the motor 21. The engagement of the armature 93 of relay 18, with contact 35, maintains relay 47 in a closed condition, since it provides a new path to ground through the conductors 46 and 34. This maintains the brake in an "off" position and the motor winding 80 is connected to the right-hand terminal of the secondary of transformer 81, through condenser 97, conductor 76, and resistor 77. This causes the motor to reverse and drive the condenser gang in the opposite direction to its previous travel, but the inclusion of the resistor 77 causes the motor speed to be reduced.

The R. C. network 48, 49 across relay 47, will have delayed the opening time of this relay when the armature 93 of relay 18 was switched from contact 61 to contact 35. This will have prevented relay 47 from shorting resistors 52 and 53 through its armatures and contacts.

The motor will now continue to run, driving the condenser gang toward the resonant point at the slower speed until the diode voltage across resistor 53 is again equal to the charge left on condenser 50. When a balance is reached, as at point 85 on the resonance curve of Fig. 2, relay 18 again opens, disengaging its armature 93 from contact 35. This will remove the ground connection from the winding 80, deenergizing the motor. The brake will engage since the solenoid coil 33 is now without a ground and the signal input to the electrode assemblies 19 and 20 is short circuited through the contacts and armatures of relay 47.

In the event the gang is driven to the extreme open position, the raised portion on the cam 29 will close the switch 30, initiating a new cycle of events, such as that just described, in the same manner as the closing of the switch 13.

With the system illustrated and described, it has been found entirely feasible to achieve an accuracy of .1 of a degree of condenser positioning. This degree of accuracy is considerably better than that which could be achieved with previously known tuning systems.

What is claimed is:

1. A system for automatically tuning the tank circuit of a crystal controlled oscillator of a multi-channel radiant energy receiver to resonance at the frequency of a crystal selectively inserted into the said circuit of said oscillator, said system comprising: a tuning element for said tank circuit, means responsive to said insertion to drive said tuning element to a reference position, means responsive to the arrival of said tuning element at said reference position to drive said tuning element in the opposite sense until the resonant frequency of said tank circuit passes through the frequency of said selected crystal, means responsive to a diminution in the output of said oscillator as the resonant frequency of said tank circuit passes beyond the frequency of said crystal to reverse the movement of said tuning element and to drive it at a slower speed, and means responsive to the increased output of said tank circuit as its resonant frequency approaches the frequency of said selected crystal to stop the movement of said element.

2. In a radiant energy receiver including a crystal controlled oscillator having a tank circuit, means for automatically tuning said tank circuit until its resonant frequency equals the frequency of a crystal selectively inserted into the oscillator circuit, said means comprising: a tuning element in said tank circuit, means responsive to the insertion of said crystal to drive said tuning element to a reference position, means responsive to the arrival of said tuning element at said reference position to drive said tuning element in the opposite direction until the resonant frequency of said tank circuit passes through the frequency of said selected crystal, a pair of energy storage circuits having different time constants, means applying the output of said oscillator to said storage circuits, means responsive to a predetermined difference in the energy content of said storage circuits to reverse the drive of said element and to drive said element at a slower speed until the energy content of said storage circuits again becomes equal and means responsive to the equality of energy content in said storage circuits to stop said driving means.

3. In a radiant energy receiver including a crystal controlled oscillator having a tank circuit, means for automatically tuning said tank circuit until its resonant frequency equals the frequency of a crystal selectively inserted into the oscillator circuit, said means comprising: a tuning element in said tank circuit, reversible driving means for said tuning element, means responsive to the insertion of said crystal to energize said driving means to drive said element to a reference position, means actuated by the arrival of said tuning element at said reference position to cause said driving means to drive said tuning element in a direction opposite to its initial travel until the resonant frequency of said tank circuit passes through the frequency of said selected crystal, a relay means operative when energized to cause said driving means to drive said element in its initial direction and operable when subsequently deenergized to cause said driving means to stop, an energizing circuit for said relay means, means applying the output of said tank circuit to said energizing circuit, said energizing circuit comprising a pair of energy storage circuits having different time constants, and means differentially combining the outputs of said storage circuits and applying the resultant to said relay means, whereby said relay means is energized by the diminution of the output of said tank circuit after the resonant frequency of said tank circuit has passed through the frequency of said selected crystal and is subsequently deenergized when the output of said tank circuit increases, and means disabling said energizing circuit, until said tuning element is driven to said reference position.

4. In a radiant energy receiver including a crystal controlled oscillator having a tank circuit, means for automatically tuning said tank circuit until its resonant frequency equals the frequency of a crystal selectively inserted into the oscillator circuit, said means comprising: a tuning element in said tank circuit, reversible driving means for said tuning element, a first relay means operative when activated to energize said driving means for operation in a sense to drive said tuning element to a reference position, means operated by the insertion of said crystal into the oscillator circuit to activate said first relay means whereby said turning element is driven to said reference position, a pair of energy storage circuits coupled to said tank circuit, said energy storage circuits having different time constants, means providing a low resistance path between said energy storage circuits, a second relay means operative when activated to interrupt said low resistance path, a third relay means operative when activated to energize said driving means in a sense to reverse the movement of said tuning element and to activate said second relay means, means operated by the arrival of said tuning element at said reference position to deactivate said first relay means and to activate said third relay means, a fourth relay means operative when activated to deactivate said third relay means and to energize said driving means in the same sense as said first relay means, but at a lower speed and operative when subsequently deactivated to stop said driving means, means differentially combining the outputs of said energy storage circuits and applying the combined output to the activation of said fourth relay means, whereby said fourth relay means is activated when the resonant frequency of said tank circuit has passed through the frequency of said selected crystal and its output has diminished to a predetermined level and said fourth relay means will be subsequently deactivated when the resonant frequency of the tank circuit has again substantially reached the frequency of said selected crystal.

5. In a frequency stable oscillatory system having a resonant output circuit, said output circuit including a movable tuning element, means for tuning said output circuit to the frequency of said system, said means comprising: means driving said tuning element at a high speed to a reference position outside the range of positions utilized for tuning purposes, means responsive to the arrival of said element at said reference position to drive it in the reverse direction at a high rate of speed, means comparing the amplitude of the peak output of said system with the amplitude of the instantaneous output thereof, means responsive to a predetermined difference between the amplitudes of said peak output and said instantaneous output to reverse the movement of said element and drive it at a slow speed, and means responsive to said comparison of outputs and operable when said instantaneous output again reaches a peak to stop the movement of said element.

6. In a frequency stable oscillatory system having a resonant output circuit, said output circuit including a movable tuning element, means for tuning said output circuit to the frequency of said system, said means comprising: means driving said tuning element at a high speed to a reference position outside the range of positions utilized for tuning purposes, means operated by the arrival of said element at said position to drive it in the reverse direction at a high rate of speed, a pair of energy storage circuits having different time constants, means impressing the output of said system equally upon said circuits, means responsive to a selected difference in the amount of energy stored in said circuits to reverse the movement of said element and drive it at a slow speed, and means responsive to a return of the energy content of said circuits to equality to stop the movement of said element.

References Cited in the file of this patent

UNITED STATES PATENTS

| | | |
|---|---|---|
| 2,369,542 | Dietrich | Feb. 13, 1945 |
| 2,452,878 | Tittle | Nov. 2, 1948 |
| 2,458,684 | Crandell | Jan. 11, 1949 |
| 2,478,977 | Nicholson, Jr. | Aug. 16, 1949 |
| 2,499,875 | Pifer | Mar. 7, 1950 |
| 2,499,967 | Nicholson, Jr. | Mar. 7, 1950 |
| 2,541,018 | Andrews | Feb. 13, 1951 |